United States Patent [19]

Buer et al.

[11] Patent Number: 5,712,593
[45] Date of Patent: Jan. 27, 1998

[54] LINEAR POWER AMPLIFIER WITH DISTORTION DETECTION

[75] Inventors: Kenneth Vern Buer; David Warren Corman, both of Gilbert; Bill Tabano Agar, Jr., Chandler, all of Ariz.

[73] Assignee: Motorola, Inc., Schaumburg, Ill.

[21] Appl. No.: 596,533

[22] Filed: Feb. 5, 1996

[51] Int. Cl.⁶ ........................................ H03G 3/20
[52] U.S. Cl. .................... 330/129; 330/132; 330/285
[58] Field of Search ............................ 330/129, 132, 330/140, 141, 281, 285

[56] References Cited

U.S. PATENT DOCUMENTS

| | | | |
|---|---|---|---|
| 4,631,491 | 12/1986 | Smithers | 336/149 |
| 5,469,115 | 11/1995 | Peterzell et al. | 330/129 |
| 5,532,646 | 7/1996 | Aihara | 330/285 X |

FOREIGN PATENT DOCUMENTS 3216842   3/1993   Japan ........................ 330/132

OTHER PUBLICATIONS

"Techniques To Achieve Linear Amplification At HF" by Chris Rice, *RF Design*, Dec. 1993, pp. 46–49.

"Control Theory Applied To The Problem Of Reducing Intermodulation Distortion In Nonlinear Amplifiers Under Multicarrier Operation" by M. Blanke, J. Langeland-Knudsen, Esa Estec, T.P. McElhone, *Proc. of 16th Annual Allerton Conference on Communication, Control, & Computing*, 1978, pp. 364–371.

*Primary Examiner*—Steven Mottola
*Attorney, Agent, or Firm*—Gregory J. Gorrie

[57] ABSTRACT

A power amplifier (10) suitable for satellite cellular communication systems provides highly efficient linear amplification of noise-like RF signals that have multiple carriers spread over a large instantaneous bandwidth. The amount of distortion present in the output is detected (14, 16, 18) and a feedback signal is provided to control the bias point of the active devices. As drive levels increase, the increased harmonic distortion power detected causes the power amplifier bias to increase thus reducing distortion. The control circuit (20) continually re-biases the power amplifier (12) for maximum efficiency for a predetermined level of distortion. The control circuit (20) may be adjusted to maximize efficiency while maintaining an allowable distortion level over the entire dynamic range of the devices.

19 Claims, 2 Drawing Sheets

LINEAR POWER AMPLIFIER WITH DISTORTION DETECTION

FIELD OF THE INVENTION

This invention relates in general to the field of RF power amplifiers, particularly to low distortion microwave power amplifiers, and more particularly to microwave and millimeter wave power amplifiers for signals having multiple carrier frequencies.

BACKGROUND OF THE INVENTION

In any communication system, it is desirable for RF power amplifiers to linearly amplify RF signals in a highly efficient manner. However, there are tradeoffs between maximum efficiency and high linearity. Efficiency is generally proportional to input drive level, and high efficiency is usually not attained until an amplifier approaches its maximum output power, which is general not consistent with linear operation. High linearity is generally evidenced by a low levels of non-linear intermodulation products and harmonic distortion. However, low levels of intermodulation products and harmonic distortion generally require low input drive levels.

In many situations, the RF signals that need to be amplified in cellular communication systems include multiple carrier frequencies spread over a large instantaneous bandwidth. The noise-like characteristics of these multiple-carrier signals make it difficult to amplify such signals in a linear fashion.

A key issue in operation of multi-carrier linear power amplifiers is the noise-like characteristic of the multiple carrier signals. In the case of single frequency linear power amplifiers, the power amplifier need only respond to constant or near constant envelopes. However, the RF amplitude envelope of noise-like multi-carrier signals changes in time according to the total occupied signal bandwidth. Multi-carrier linear power amplifiers should respond to this changing envelopes in order to obtain high efficiency and linear operation. Therefore, there are additional network design requirements for multi-carrier linear power amplifiers above and beyond that of single frequency linear power amplifiers.

Efficiency and high linearity are especially important in satellite, mobile and airborne communication systems because of the limited power resources available. Furthermore, size, weight and cost of DC power are at a premium. Typical power amplifier applications, for example in cellular communication systems, use automatic level control loops to adjust the transmitted power up and down to, among other things, compensate for distance changes, overcome path obstructions etc. As a result, an RF power amplifier is required to operate over large dynamic ranges on the order of 30 dB. In systems using microwave and millimeter wave frequencies for communication, class "A" amplifiers are generally used because they provide linearity over a large dynamic range. However, a class "A" RF amplifier consumes a constant amount of DC power regardless of the RF drive (output) level. Therefore, efficiency drops rapidly as the drive level is decreased making class "A" amplifiers less desirable for applications, such as satellite and mobile cellular systems, where high efficiency is desirable.

Many cellular communication systems use Class B or C amplifiers along with filtering and feed-forward amplifiers or predistortion to linearize the signal. These techniques are not practical at higher frequencies since they require very careful characterization and phase matching. Less linear RF amplifiers, such as class "AB", class "B" or class "C" are generally more efficient over a large dynamic range. However multicarrier communication systems such cellular communication systems that use FDMA/TDMA or CDMA require high linearity to minimize the amount of interference and proper system operation.

Thus what is needed is an RF power amplifier that is highly linear and highly efficient. What is also needed is an RF power amplifier that amplifies multi-carrier noise-like signals suitable for use in a satellite communication system where power consumption is a critical factor. What is also needed is a RF power amplifier that is linear and efficient over a large dynamic range. What is also needed is a RF power amplifier that is linear and efficient for multi-carrier noise-like signals. What is also needed is a RF power amplifier that is linear and efficient for both continuous wave (CW) carrier signals as well as multi-carrier noise-like signals. What is also needed is a linear and efficient power amplifier that has low bias power consumption, and is lightweight and manufacturable.

BRIEF DESCRIPTION OF THE DRAWINGS

The invention is pointed out with particularity in the appended claims. However, a more complete understanding of the present invention may be derived by referring to the detailed description and claims when considered in connection with the figure.

The exemplification set out herein illustrates a preferred embodiment of the invention in one form thereof, and such exemplification is not intended to be construed as limiting in any manner.

DETAILED DESCRIPTION OF THE DRAWINGS

The present invention provides, among other things, a power amplifier that linearly amplifies noise-like multi-carrier signals over a wide range of power levels. The present invention also provides a high efficiency RF power amplifier suitable for use in satellite telecommunication systems. The present invention also provides an RF power amplifier suitable for fabrication on a Gallium Arsenide (GaAs) substrate.

Figure 1:
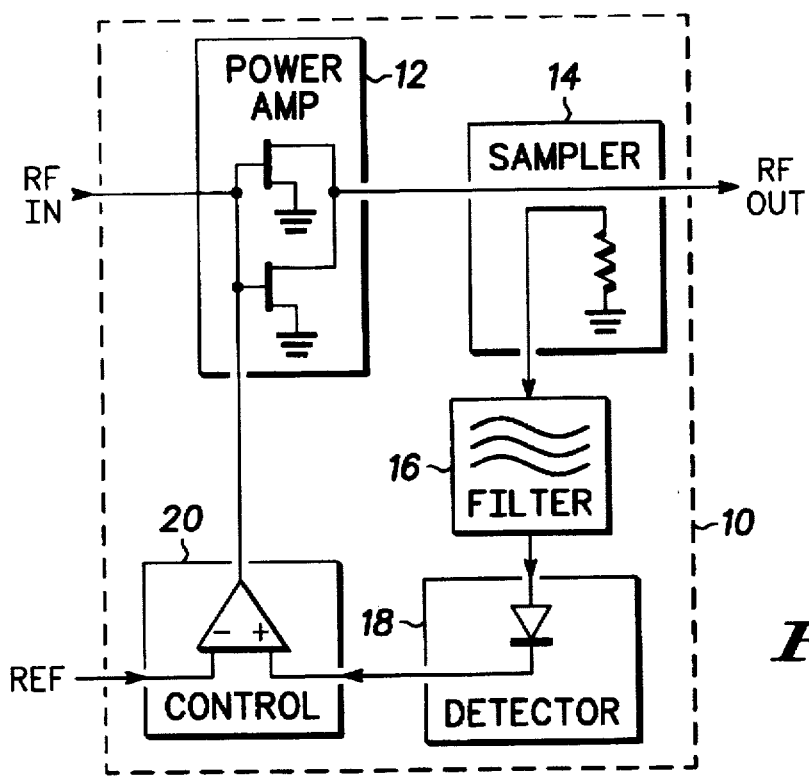
FIG. 1 shows a block diagram of a power amplifier in accordance with a preferred embodiment of the present invention.

FIG. 1 shows a block diagram of power amplifier 10 in accordance with a preferred embodiment of the present invention. Power amplifier 10 includes power amplifier portion 12, sampler 14 coupled to an output of power amplifier portion 12, loop filter 16 coupled to sampler 14, power detector 18 coupled to filter 16, and bias control portion 20 coupled to power detector 18 and power amplifier portion 12.

Power amplifier portion 12 receives RF input signals from an input port of power amplifier 10 and provides an amplified output signal. Preferably, power amplifier portion 12 comprises amplifier circuits that provide substantially linear amplification of the RF input signal. For example class "A" type amplifiers are suitable, and a class "AB" type multi-stage amplifier circuit is preferable. In the preferred embodiment, power amplifier portion 12 comprises a plurality of custom monolithic microwave integrated circuit (MMIC) devices (preferably between one and fifteen devices) fabricated on Gallium Arsenide (GaAs) substrates. The MMIC devices desirably include between six and twelve Pseudomorphic High Electron Mobility Transistors (PHEMT) with 0.25 micron gate lengths along with the associated matching and interconnect structures. The MMICs may be fabricated, for example, using a Raytheon 06A MMIC process.

In one embodiment, power amplifier portion 12 includes nine MMIC device. In this embodiment, five of the MMIC devices are medium power amplifier chips (MPA's) that include two gain stages with total gate widths between 0.8 and 1.6 millimeters. In this embodiment, the other four MMICs are High power amplifiers (HPA's) that include two gain stages and having total gate widths between 2.4 and 4.0 millimeters. Power amplifier portion 12 is configured such that the input is connected to one MPA MMIC, for which the output RF signal is split four ways and connected to the input of the remaining four MPA's. Each of the four MPA's then drives an HPA, the outputs of which are combined to produce between three and four watts of RF power at 23.3 GHz. The MMICs are interconnected using Duroid 6002 substrate material well know in the art. The entire amplifier has between 30 and 35 dB of gain. Other power amplifier portion configurations other that the one described above are suitable for use in the present invention.

Power amplifier portion 12 is suitable for the amplification of modulated single carrier signals, and preferably is designed to amplify multicarrier signals in the K-band frequency range. The RF input signal may include K-band multicarrier signals spread out over a bandwidth of five GHz.

Although the output of power amplifier portion 12 is desirably substantially linear, some non-linearities result from the amplification process and are present in the output signal. These non-linearities may be in the form of harmonic and intermodulation distortion products.

Sampler 14 samples the amplified output signal from power amplifier portion 12 and provides the sampled signal to filter 16. Sampler 14 also passes through the amplified output signal to the RF output port of power amplifier 10. In the preferred embodiment, sampler 14 is a distributed element 20 dB or 30 dB coupler comprising parallel coupled lines. The sampled signal provided to filter 16 is accordingly, either 20 dB or 30 dB lower than the RF output signal.

Loop filter 16 produces a filtered signal by filtering out the desired signal leaving an undesired portion of the signal. Preferably, filter 16 passes at least a portion of the harmonics and/or intermodulation spurs of the signal of interest. In the preferred embodiment, filter 16 is a band reject filter designed to reject the signal of interest, however, high-pass, low-pass or band pass filters may be used provided that the output signal of the filter includes a sample of the non-linearities of the signal of interest. Filter 16 is preferably a distributed element filter and may, for example, be comprised of a waveguide-type filter, a cavity type filter, a dielectric resonator-type filter, although other filter-types are also suitable.

The filtered output signal from loop filter 16 is provided to power detector 18 which converts the filtered output signal to a DC signal proportional to the power level of the filtered output signal. In the preferred embodiment, an RF detector is used, preferably a Schottkey diode detector that provides a voltage to bias control portion 20. Accordingly, the DC signal provided to bias control portion 20 is proportional to the non-linearities in the RF output signal of power amplifier 10.

Bias control portion 20 compares the DC signal provided by power detector 18 to a reference signal to produce a control signal. The reference signal may be predetermined or controlled by the system in which power amplifier 10 operates. Bias control portion 20 provides the control signal to power amplifier portion 12. The control signal controls the saturation characteristics of power amplifier portion 12, preferably by adjusting the bias of the active devices. The bias of the active devices may include the voltage bias, current bias or both. For example, when power amplifier portion 12 comprises FET devices, the control signal may change the DC power to the FETs by changing the gate voltage. Accordingly, their quiescent bias points are changed affecting DC power consumption for the same signal RF output power. In this way, a predetermined amount of nonlinearity present in the output signal may be maintained.

In general, the amount of distortion present in the output is detected and a feedback signal is provided to control the bias point of the active devices. As drive levels increase, the increased harmonic distortion or intermodulation distortion power detected causes the power amplifier bias to increase thus reducing distortion. The control circuit continually re-biases the power amplifier for maximum efficiency for a predetermined level of distortion. The control circuit may be adjusted to maximize efficiency while maintaining an allowable distortion level over the entire dynamic range of the devices.

In the preferred embodiment described above, amplifier 10 has between 30 and 35 dB of gain. The individual portions of amplifier 10 are preferably fabricated on separate GaAs substrates and interconnected using Duroid, however any or all components may be built using lumped or distributed elements.

Figure 2:
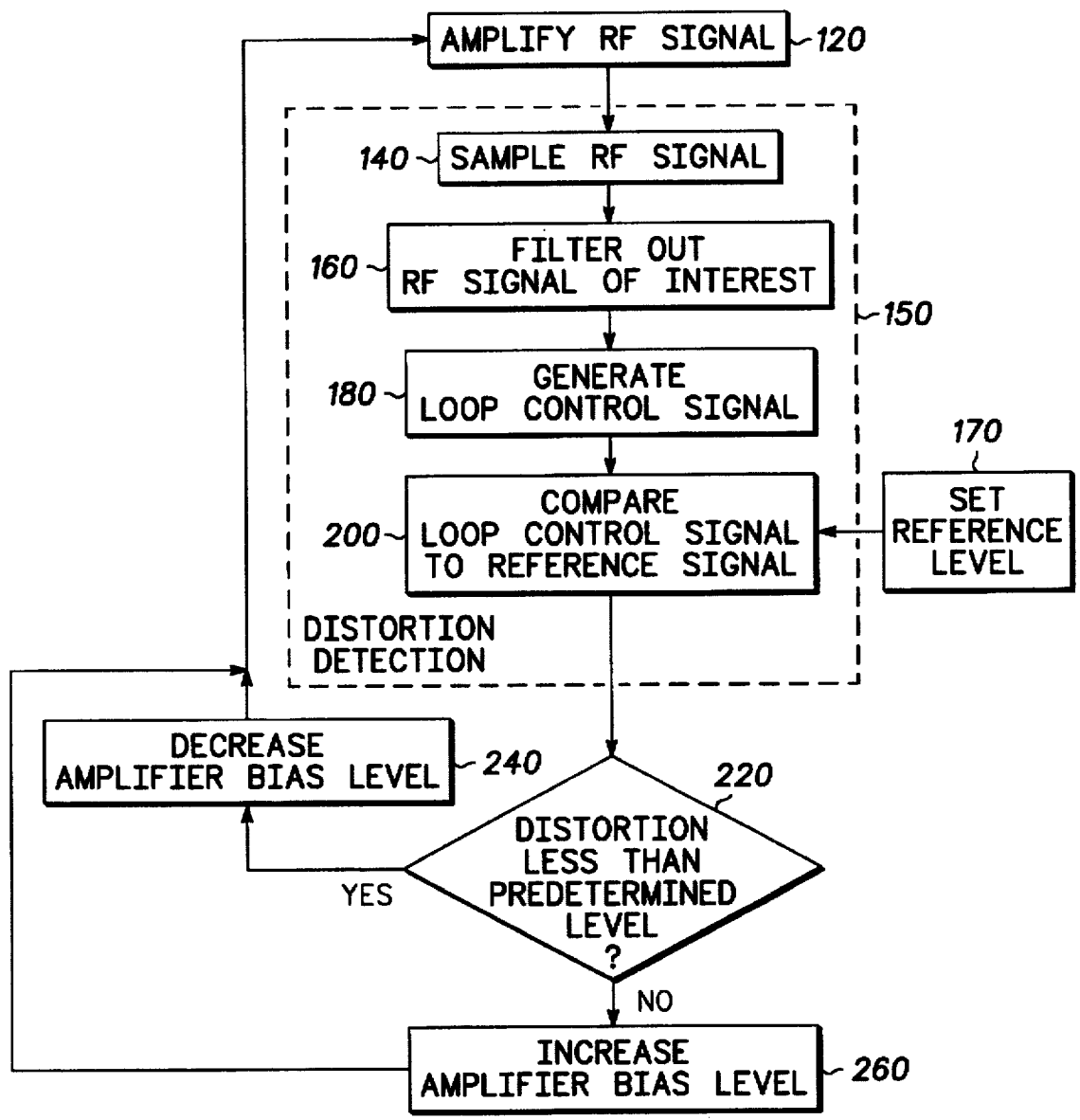
FIG. 2 is a flow chart of a procedure illustrating the steps performed by a power amplifier in accordance with a preferred embodiment of the present invention.

FIG. 2 is a flow chart of procedure 100 illustrating the steps performed by a power amplifier in accordance with a preferred embodiment of the present invention. Preferably, procedure 100 is performed by a configuration similar to that of power amplifier 10 (FIG. 1), although other suitable configurations may be used. In task 120, an RF input signal is amplified. The amplifier saturation characteristics are determined by a bias level that, among other things, is controlled by the amount of nonlinearities in the amplified output signal.

Procedure 100 includes distortion detection tasks 150. After the RF input signal is amplified, the amplified signal is sampled in task 140 of distortion detection tasks 150. Task 140 provides a sampled signal similar to the amplified signal, but preferably at a much lower power level, for example on the order of 20 dB or 30 dB lower.

Task 160 filters out the signal of interest from the sampled signal and provides, preferably, everything but the signal interest. At least some of the non-linearities of the signal of interest are passed by task 160. Task 180 generates a loop control signal proportional to filtered signal from task 160. Task 200 compares the loop control signal from task 180 to reference signal 170. Preferably, the loop control signal and the reference signal are DC voltages. Task 220 determines when the reference signal is less than the loop control signal. When the reference signal is less than the loop control signal, this indicates that the amount of non-linearities are greater than desired and therefor should be reduced. When the reference signal is greater than the loop control signal, this indicates that the amount of non-linearities are at or below an acceptable level.

When the non-linearities are greater than desired, task 260 is performed which may increase the bias level of the amplifier so as to reduce the generation of non-linearities. When the non-linearities are at or below an acceptable level, task 240 is performed which may reduce the bias level of the amplifier to produce higher efficiency operation. Other factors go into determining the output power level for communicating, and may be included by adjustments to the reference signal 170.

The loop of the tasks in procedure 100 is performed on a substantially continuous basis so as to generate an RF output signal for power amplifier 10 (FIG. 1) having non-linearities below an acceptable level while providing maximum efficiency. As a result, the efficiency of power amplifier 10 is dramatically improved over a wide dynamic range.

Figure 3:
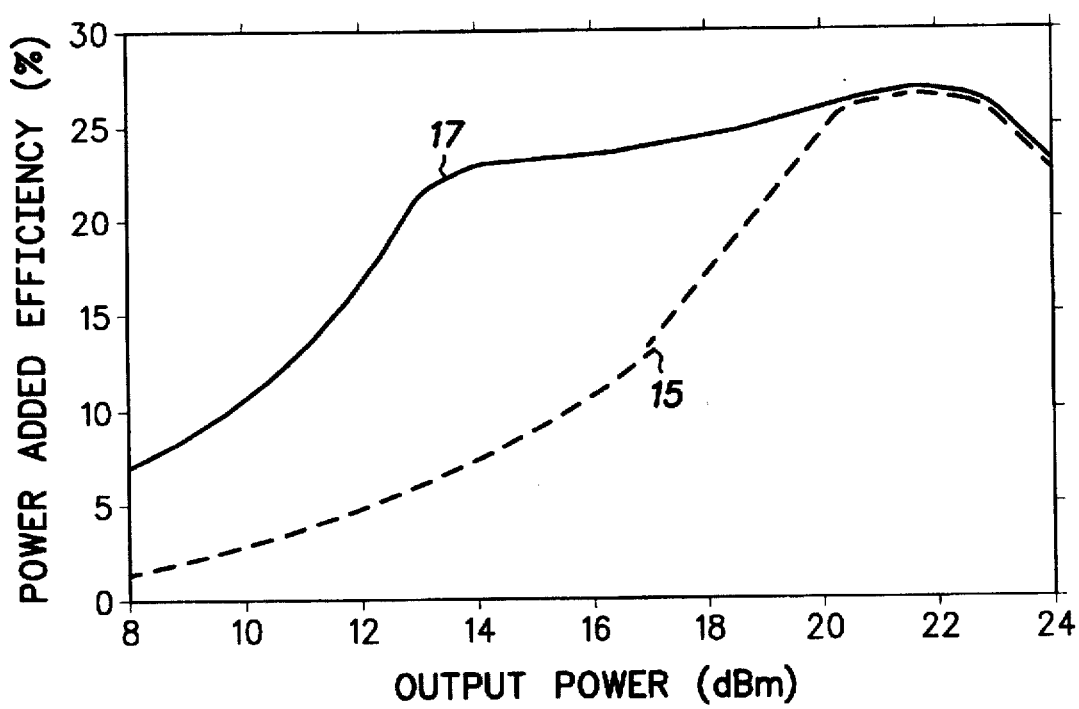
FIG. 3 is a graph illustrating a comparison of power added efficiency as a function of output power.

FIG. 3 is a graph illustrating a comparison of power-added efficiency as a function of output power. This graph illustrates efficiency improvement for power amplifier 10 (FIG. 1) wherein power amplifier portion 12 includes only one of the MPA driver MMIC devices. The efficiency improvement of amplifier 10 when power amplifier portion 12 includes additional MMIC devices is generally proportional to the improvement associated with each of the devices. In FIG. 3, power added efficiency (in percent) is shown on the Y-axis while output power (in dBm) is shown on the X-axis. Graph 17 illustrates the power added efficiency a power amplifier using distortion feedback and bias control in accordance with a preferred embodiment of the present invention. Graph 15 illustrates the power added efficiency of a typical class 'A' type power amplifier without distortion feedback.

Graph 15 shows that efficiency improves with output power level which is typical for a typical class "A" type amplifiers. This is due, at least in part, to the fact that a class "A" amplifier is turned on all the time and consumes generally a constant amount of DC power regardless of the output power level. Accordingly, maximum efficiency is attained at maximum power levels.

Graph 17 shows a significant improvement in efficiency at lower output power levels over that of graph 15. Although the amplifier portion is biased as a class "A" type amplifier providing maximum linearity, high efficiency is obtained by detecting the distortion power at the output and controlling the amplifier bias to the minimum level possible. Thus the amount of DC power wasted on "overhead" in a typical class "A" amplifier is minimized by the use of distortion detection and feedback.

In the preferred embodiment that includes a nine MMIC devices in power amplifier portion 12, power amplifier 10 has a power-added efficiency between 20 and 30 percent for output power levels of between 22 and 36 dBm. In this embodiment, amplifier portion amplifies an RF input signal between 30 and 35 dB. The RF input signal may be a multi-carrier signal having noise-like characteristics. Power amplifier portion 12 preferably has a gain of between 7 and 11 dB, and has a power out of between 3 and 4 watts.

Other advantages are realized due to the increased efficiency. For example, less DC power is used which produces less heat, which increases amplifier gain and dynamic range. Furthermore, the amplifier is operated at a lower stress level which increases reliability and extends the expected life of the system in which it operates. In satellite and mobile communication systems, these advantages are significant because DC power is at a premium and parts cannot be readily replaced.

Thus a power amplifier has been described that is able to handle noise-like multi-carrier signals and is able to operate efficiently over a wide range of signal power levels.

Accordingly, the present invention is suitable for satellite and mobile communication systems, and especially suitable for such cellular communication systems which use modulation schemes which require high linearity. This power amplifier is also suitable for use in satellite based telecommunication systems where efficiency is critical because of limited battery and solar power. Further, this power amplifier is suitable for use in cellular telecommunication systems that use multiple carrier frequencies spread over a large instantaneous bandwidth. The present invention overcomes specific problems and accomplishes certain advantages relative to prior art methods and mechanisms. For example, high efficiency and high linearity are achieved over a range of power levels. The improvements over known technology are significant. As a result, significant cost savings are realized.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A power amplifier for linearly amplifying RF signals in a predetermined frequency range comprising:

an amplifier portion for amplifying an RF input signal and producing an RF output signal, said amplifier portion having a bias controller for controlling a bias of said amplifier; and a distortion detector portion adapted to sample said RF output signal and provide a feedback control signal to said bias controller based on an amount of distortion present in said RF output signal, wherein said feedback control signal causes said amplifier portion to increase said bias when said amount of distortion is above a distortion level, and decrease said bias when said amount of distortion is less than said distortion level.

2. A power amplifier as claimed in claim 1 wherein said distortion detector portion includes:

a sampler for sampling said RF output signal and providing a sampled signal;

a loop filter for filtering said sampled signal and providing a filtered signal;

a detector for converting said filtered signal to a DC signal proportional to said filtered signal, said amount of distortion being based on said DC signal; and a bias control portion for providing said feedback control signal to said bias controller based on said DC signal.

3. A power amplifier as claimed in claim 2 wherein said RF output signal includes a linear portion and a non-linear portion, said loop filter includes means for filtering out said linear portion, and said detector produces said DC signal proportional to said non-linear portion, wherein said amount of distortion is based on said non-linear portion.

4. A power amplifier for linearly amplifying RF signals comprising:

an amplifier portion for amplifying an RF input signal and producing an RF output signal, said amplifier portion having a bias controller; and a distortion detector portion adapted to sample said RF output signal and provide a feedback control signal to said bias controller based on an amount of distortion present in said RF output signal, wherein said distortion detector portion includes:

a sampler for sampling said RF output signal and providing a sampled signal;

a loop filter for filtering said sampled signal and providing a filtered signal;

a detector for converting said filtered signal to a DC signal proportional to said filtered signal; and a bias control portion for providing said feedback control signal to said bias controller based on said DC signal, and wherein said RF output signal includes a linear portion and a non-linear portion, said loop filter includes means for filtering out said linear portion, and said detector produces said DC signal proportional to said non-linear portion, and wherein said amplifier portion includes field effect transistor (FET) devices biased as a class 'A' configuration and having a quiescent bias point, and wherein said feedback control signal is proportional to said amount of distortion, and said bias control portion is configured to increase said quiescent bias point when said amount of distortion is above a predetermined level, and decrease said quiescent bias point when said amount of distortion is less than said predetermined level.

5. A power amplifier as claimed in claim 4 wherein said FET devices of said amplifier portion are fabricated from gallium arsenide (GaAs).

6. A power amplifier as claimed in claim 5 wherein said RF input signal includes K-band multicarrier signals spread out over a bandwidth of five GHz.

7. A power amplifier as claimed in claim 6 wherein said power amplifier has a power-added efficiency between 20 and 30 percent for output power levels of between 22 and 36 dBm.

8. A power amplifier as claimed in claim 7 wherein said RF input signal is a K-band multicarrier signal and said amplifier portion amplifies said RF input signal between 30 and 35 dB, and wherein said RF input signal is a multicarrier signal having noise-like characteristics, and wherein said amplifier portion has a gain of between 7 and 11 dB, and has a power out of between 3 and 4 watts.

9. A power amplifier as claimed in claim 8 wherein said detector produces said DC signal proportional to harmonics of said RF input signal, said harmonics comprising at least part of said non-linear portion.

10. A power amplifier as claimed in claim 9 wherein FET devices are pseudomorphic high electron mobility transistor (PHEMT) devices having a gate width between 0.8 and 4.0 millimeters.

11. A power amplifier for linearly amplifying RF signals in a predetermined frequency range comprising:

an amplifier portion for amplifying an RF input signal and producing an RF output signal, said amplifier portion having a bias controller for controlling a bias of said amplifier;

a sampler for sampling said RF output signal and providing a sampled signal;

a loop filter for filtering said sampled signal and providing a filtered signal;

a detector for converting said filtered signal to a DC signal proportional to said filtered signal, said DC signal based on an amount of distortion present in said RF output signal; and a bias control portion for providing a feedback control signal to said bias controller based on said filtered signal, wherein said feedback control signal causes said amplifier portion to increase said bias when said amount of distortion is above a distortion level, and decrease said bias when said amount of distortion is less than said distortion level.

12. A power amplifier as claimed in claim 11 wherein said RF output signal includes a linear portion and a non-linear portion, said loop filter includes means for filtering out said linear portion, and said detector produces said DC signal proportional to said non-linear portion.

13. A power amplifier for linearly amplifying RF signals comprising:

an amplifier portion for amplifying an RF input signal and producing an RF output signal, said amplifier portion having a bias controller;

a sampler for sampling said RF output signal and providing a sampled signal:

a loop filter for filtering said sampled signal and providing a filtered signal:

a detector for converting said filtered signal to a DC signal proportional to said filtered signal; and a bias control portion for providing a feedback control signal to said bias controller based on said filtered signal, wherein said RF output signal includes a linear portion and a non-linear portion, said loop filter includes means for filtering out said linear portion, and said detector produces said DC signal proportional to said non-linear portion, and wherein said amplifier portion includes field effect transistor (FET) devices biased as a class 'A' configuration, said FET devices fabricated from gallium arsenide (GaAs).

14. A power amplifier as claimed in claim 13 wherein said RF input signal includes K-band multicarrier signals spread out over a bandwidth of five GHz, and wherein said detector produces said DC signal proportional to harmonics of said RF input signal, said harmonics comprising at least part of said non-linear portion.

15. A method of linearly amplifying an RF signal in a predetermined frequency range comprising the steps of:

(a) amplifying a RF input signal in an amplifier portion to produce an amplified signal, said amplified signal having non-linear components and linear components, said amplifier portion having a bias controller for controlling a bias of said amplifier;

(b) sampling said amplified signal to provide a sampled signal;

(c) filtering said sampled signal to remove said linear components and produce a filtered signal proportional to said non-linear components;

(d) converting said filtered signal to a control signal proportional to said non-linear components; ( e) comparing said control signal to a reference signal to produce a feedback signal proportional to a difference between said reference signal and said control signal; and (f) changing said bias of said amplifier portion based on said feedback signal, said feedback signal causing said amplifier portion to increase said bias when said non-linear components are above a distortion level, and decrease said bias when said amount of distortion is less than said distortion level.

16. A method as claimed in claim 15 wherein said RF input signal is a K-band multicarrier signal and the amplifying step includes the step of amplifying said RF input signal between 30 and 35 dB.

17. A method of linearly amplifying an RF signal comprising the steps of:

(a) amplifying a RF input signal in an amplifier portion to produce an amplified signal, said amplified signal having non-linear components and linear components;

(b) sampling said amplified signal to provide a sampled signal;

(c) filtering said sampled signal to remove said linear components and produce a filtered signal;

(d) converting said filtered signal to a control signal proportional to said non-linear components;

(e) comparing said control signal to a reference signal to produce a feedback signal proportional to a difference between said reference signal and said control signal; and (f) changing a quiescent bias point of said amplifier portion based on said feedback signal, wherein said RF input signal is a K-band multicarrier signal and the amplifying step includes the step of amplifying said RF input signal between 30 and 35 dB, wherein said amplified signal includes a linear portion and a non-linear portion, said filtering step filters out said linear portion, and the converting step converts said non-linear portion to a DC signal proportional to said non-linear portion, and wherein said RF input signal includes K-band multicarrier signals spread out over a bandwidth of five GHz, and wherein and the converting step produces a DC signal proportional to harmonics of said RF input signal, said harmonics comprising at least part of said non-linear portion.

18. A method as claimed in claim 17 wherein said amplifier portion includes a plurality of transistors having said quiescent bias point, and wherein said feedback signal is proportional to an amount of distortion in said amplified signal, and wherein the changing step includes the steps of:

increasing said quiescent bias point when said amount of distortion is above a predetermined level; and decreasing said quiescent bias point when said amount of distortion is less than said predetermined level.

19. A power amplifier for linearly amplifying RF signals comprising:

an amplifier portion for amplifying an RF input signal and producing an RF output signal, said amplifier portion having a bias controller; and a distortion detector portion adapted to sample said RF output signal and provide a feedback control signal to said bias controller based on an amount of distortion present in said RF output signal, wherein said distortion detector portion includes:

a sampler for sampling said RF output signal and providing a sampled signal;

a loop filter for filtering said sampled signal and providing a filtered signal;

a detector for converting said filtered signal to a DC signal proportional to said filtered signal; and a bias control portion for providing said feedback control signal to said bias controller based on said DC signal, wherein said RF output signal includes a linear portion and a non-linear portion, said loop filter includes means for filtering out said linear portion, and said detector produces said DC signal proportional to said non-linear portion, wherein said amplifier portion has a bias associated therewith, and said feedback control signal is proportional to said amount of distortion, and said bias control portion is configured to increase said bias when said amount of distortion is above a predetermined level, and decrease said bias when said amount of distortion is less than said predetermined level.

* * * * *